United States Patent
Shibahara et al.

(10) Patent No.: US 8,942,464 B2
(45) Date of Patent: Jan. 27, 2015

(54) PATTERN MEASURING APPARATUS, AND PATTERN MEASURING METHOD AND PROGRAM

(75) Inventors: Takuma Shibahara, Tokyo (JP); Tsuyoshi Minakawa, Yokohama (JP); Michio Oikawa, Machida (JP); Yutaka Hojo, Hitachinaka (JP); Hitoshi Sugahara, Hitachioota (JP); Hiroyuki Shindo, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 93 days.

(21) Appl. No.: 13/700,018

(22) PCT Filed: Mar. 28, 2011

(86) PCT No.: PCT/JP2011/057654
§ 371 (c)(1),
(2), (4) Date: Dec. 21, 2012

(87) PCT Pub. No.: WO2011/152106
PCT Pub. Date: Dec. 8, 2011

(65) Prior Publication Data
US 2013/0223723 A1    Aug. 29, 2013

(30) Foreign Application Priority Data
Jun. 2, 2010   (JP) ................................ 2010-126407

(51) Int. Cl.
G06T 7/00    (2006.01)
G01B 21/20   (2006.01)
H01J 37/22   (2006.01)
(Continued)

(52) U.S. Cl.
CPC .............. *G06T 7/0004* (2013.01); *G01B 21/20* (2013.01); *H01J 37/222* (2013.01); *H01J 37/28* (2013.01); *G06T 7/0006* (2013.01); *H01J 2237/24578* (2013.01); *H01J 2237/24592* (2013.01); *H01L 22/12* (2013.01); *G06T 2207/10061* (2013.01); *G06T 2207/30148* (2013.01)
USPC ............................................ 382/145; 438/14

(58) Field of Classification Search
None
See application file for complete search history.

(56) References Cited

U.S. PATENT DOCUMENTS

| 7,507,961 B2 * | 3/2009 | Toyoda et al. ............... 250/310 |
| 8,006,203 B2 * | 8/2011 | Fan et al. ......................... 716/54 |
| 2003/0061592 A1 * | 3/2003 | Agrawal et al. ................. 716/19 |

(Continued)

FOREIGN PATENT DOCUMENTS

| JP | 2001-338304 A | 12/2001 |
| JP | 2005-116795 A | 4/2005 |

(Continued)

OTHER PUBLICATIONS

PCT International Search Report. PCT/JP2011/057654, dated May 24, 2011, 2 pages.

*Primary Examiner* — Jon Chang
(74) *Attorney, Agent, or Firm* — Foley & Lardner LLP

(57) ABSTRACT

The present invention provides a pattern measuring apparatus (600) that: acquires the image contour of a circuit pattern formed by transferring design data; classifies the acquired image contour into shape structures; calculates normal vectors for each shape structure; maps the shape structures to the image contour; uses at least one normal direction for each shape structure to stabilize the normal directions to the image contour; and uses the normal vectors for each shape structure to determine the position of a SEM contour.

9 Claims, 14 Drawing Sheets

(51) Int. Cl.
*H01J 37/28* (2006.01)
*H01L 21/66* (2006.01)

(56) References Cited

U.S. PATENT DOCUMENTS

| | | |
|---|---|---|
| 2005/0121610 A1 | 6/2005 | Abe |
| 2006/0101370 A1* | 5/2006 | Cui et al. ............ 716/19 |
| 2006/0245636 A1 | 11/2006 | Kitamura et al. |
| 2007/0023653 A1 | 2/2007 | Toyoda et al. |
| 2008/0130982 A1 | 6/2008 | Kitamura et al. |
| 2009/0052765 A1* | 2/2009 | Toyoda et al. ............ 382/149 |
| 2009/0123058 A1* | 5/2009 | Ito ............ 382/144 |
| 2009/0152463 A1* | 6/2009 | Toyoda et al. ............ 250/311 |
| 2009/0202139 A1* | 8/2009 | Toyoda et al. ............ 382/145 |
| 2009/0212212 A1* | 8/2009 | Shishido et al. ............ 250/307 |
| 2011/0129140 A1 | 6/2011 | Kitazawa et al. |

FOREIGN PATENT DOCUMENTS

| | | |
|---|---|---|
| JP | 2006-351888 A | 12/2006 |
| JP | 2007-149055 A | 6/2007 |
| JP | 2008-164593 A | 7/2008 |
| JP | 2010-032308 A | 2/2010 |

* cited by examiner

FIG. 3
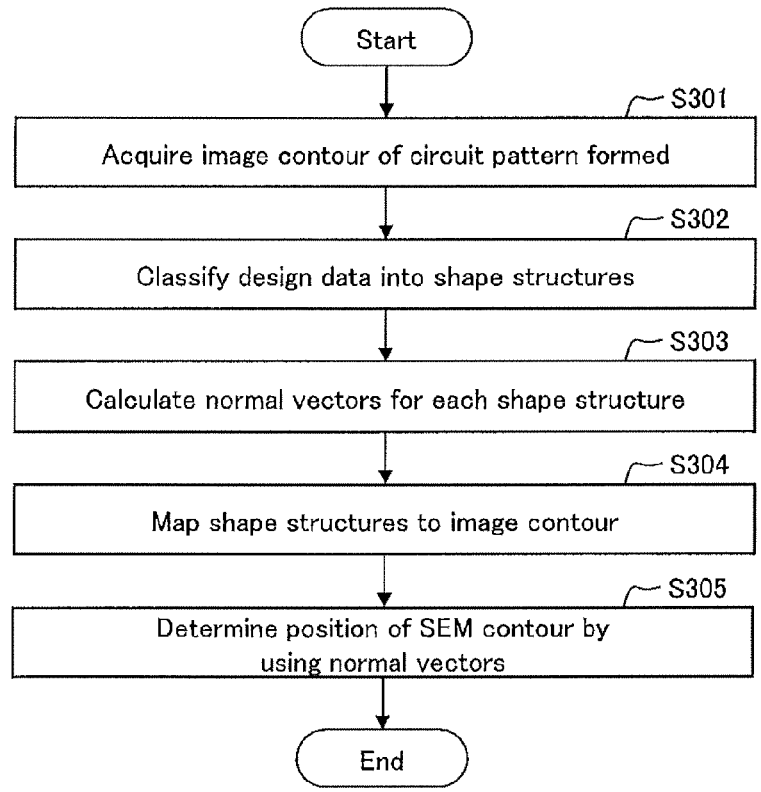
FIG. 4A
FIG. 4B
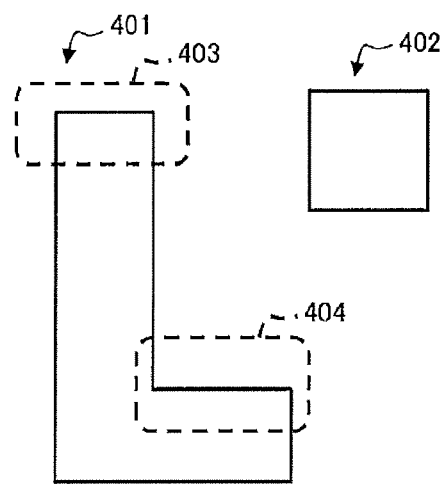
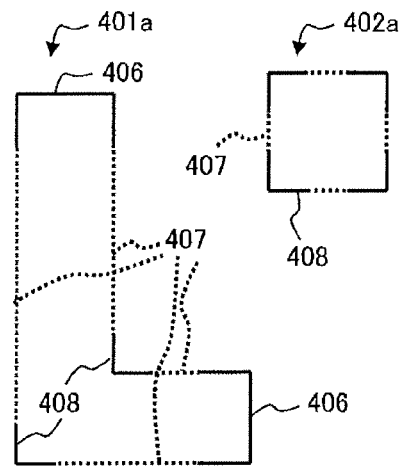

Candidate for EOL
904
902
901    903

EOL
911
910

PATTERN MEASURING APPARATUS, AND PATTERN MEASURING METHOD AND PROGRAM

TECHNICAL FIELD

The present invention relates to a technique for determining with high accuracy the shape of a circuit pattern for a semiconductor device.

PRIOR ART

In the fabrication of semiconductor devices, a photolithography process is used for transferring design data via a photomask to a wafer to form a circuit pattern on the wafer. In the photolithography process, it is known that due to optical proximity effects, the circuit pattern formed on the wafer has a different shape from that of the design data. For example, by transferring a shape of design data 101 of FIG. 1 via the photomask, a circuit pattern 102 (shown with dots) is formed on the wafer. The shape of the circuit pattern 102 is different from that of the design data 101 in that it is rounded at a CORNER portion 103 and rounded and shrunk at an EOL (End-of-Line) 104.

In order to provide a desired shape for the circuit pattern 102, processing is performed to change the shape of the design data 101 to that of design data 105 shown in FIG. 1B beforehand by taking into consideration optical proximity effects. The technique is called OPC (Optical Proximity Correction). OPC is a technique used to adjust line widths and correct errors at EOL and CORNER portions of the photomask beforehand in consideration of optical proximity effects. Thus, transferring the design data 105 via the photomask results in a circuit pattern 106 shown on the right side of FIG. 1B which has a shape closer to a desired one.

In general, in the performance of OPC, various measurement apparatuses including a CD-SEM (Critical Dimension Scanning Electron Microscope) are used to measure the dimensions and shape of a circuit pattern formed, for correcting the shape of a photomask. From the view point of OPC accuracy improvement, therefore, it is important to measure the shape of the formed circuit pattern with high accuracy.

FIG. 2A shows an example of an image of a circuit pattern formed on a wafer that is captured by the CD-SEM. As shown in FIG. 2A, the contour of the circuit pattern is imaged not as a line but as a white band 201. Reference Numeral 202 denotes a region without the circuit pattern, whereas Reference Numeral 203 denotes a region with the circuit pattern (corresponding to a region denoted by Reference Numeral 106 in FIG. 1B).

Patent Document 1 discloses a technique for measuring the contour of a circuit pattern. The technique of Patent Document 1 uses normal vectors 204 (204a-204d) indicative of normal directions to the white band 201, as shown in FIG. 2A. Rectangular regions containing the normal vectors 204, respectively, are referred to as profile acquisition sections. The profile acquisition section is a section where the luminance value (profile) of image data is acquired in the direction of the normal vector 204. FIG. 2B shows, as an example, a graph with the abscissa representing the direction of the normal vector 204a and the ordinate representing the luminance value of each of pixels in the profile acquisition section. In FIG. 2B, the position of the pixel with the maximum luminance value is referred to as a center 210 of the white-band, and a line formed by connecting the white-band centers 210 is referred to as the contour of the image. To determine a real contour 211 of the circuit pattern, the luminance values of the white-band centers 210 are each multiplied by a given factor (paragraph [0161] of Patent Document 1) to obtain luminance values and thereby determine the positions of the pixels with the thus obtained luminance values (paragraph [0161] of Patent Document 1). These pixels are connected to form a line which is the real contour 211 referred to as a SEM (Scanning Electron Microscope) contour. The SEM contour is the circuit pattern contour as the target.

PRIOR ART DOCUMENT

Patent Document

Patent Document 1:
 Japanese Unexamined Patent Application Publication No. 2001-338304

DISCLOSURE OF THE INVENTION

Objective to be Achieved by the Invention

The technique of Patent Document 1 involves connecting the white band centers in the image captured by the CD-SEM to form a line, extracting the line as the image contour, and then extracting the luminance values of the pixels arranged in each of normal directions to the image contour. In the case of a roughened (meandering) image contour as seen from the normal vectors 204 (204a-204d) in FIG. 2A, however, the normal directions are unstable, which reduces the measurement accuracy of the SEM contour.

It is an objective of the present invention to determine the position of the SEM contour of the circuit pattern for a semiconductor device with high accuracy.

Means for Achieving the Objective

To achieve the above objective, an aspect of the present invention provides a pattern measuring apparatus that: acquires the image contour of a circuit pattern formed by transferring design data; classifies the acquired image contour into shape structures which are a LINE, a CORNER and an EOL, maps the shape structures to the image contour; determines normal directions for each shape structure to stabilize normal directions to the image contour; and uses normal vectors for each shape structure mapped on the image contour, thereby determining the position of a SEM contour.

Effect of the Invention

The present invention enables highly accurate determination of the position of the SEM contour of a circuit pattern for a semiconductor device.

BRIEF DESCRIPTION OF THE DRAWINGS

FIG. 1A shows a case without OPC, and FIG. 1B shows a case with OPC.

FIG. 2A shows an image of a pattern formed, and FIG. 2B shows luminance characteristics in the direction of a normal vector.

FIG. 3 is a flow of processing for measuring a circuit pattern according to a first embodiment.

FIGS. 4A and 4B show design data and shape structures; FIG. 4A shows design data, and FIG. 4B shows the design data classified into shape structures.

FIG. 8A shows a case in which there is a LINE between vertices of CORNERs, and FIG. 8B shows a case in which there is no LINE between the vertices of the CORNERs.

FIG. 9A shows a case in which there is a LINE between vertices of CORNERs, and FIG. 9B shows a case in which there are feet of an EOL.

FIG. 16A shows a case in which normal vectors are arranged at uniform intervals, and FIG. 16B shows a case in which the interval between normal vectors is changed according to the size of the shape structure mapped.

FIG. 18A shows OPC design data, and FIG. 18B shows the OPC design data classified into shape structures.

FIG. 19A shows how OPC bumps are different from OPC-CORNERs, and FIG. 19B shows OPC-LINEs and OPC-CORNERs.

FIG. 20A shows a case in which a shape structure is determined to be an OPC-CORNER, and FIG. 20B shows a case in which a shape structure is determined not to be an OPC-CORNER.

FIG. 21A shows a case in which a shape structure is an OPC-CORNER, and FIG. 21B shows a case in which a shape structure is an OPC-EOL.

EMBODIMENTS FOR CARRYING OUT THE INVENTION

Description will be made of modes for carrying out the invention (hereinafter referred to as "embodiments") with reference to the drawings as required.

(First Embodiment)

In a first embodiment, coordinates (hereinafter referred to as the "position") of a SEM contour of a circuit pattern are determined with the case where the circuit pattern is formed by transferring design data without OPC via a photomask.

(Outline)

With reference to FIG. 3, description will be made of a flow of processing for determining the position of the SEM contour of a circuit pattern formed.

Figure 1A:
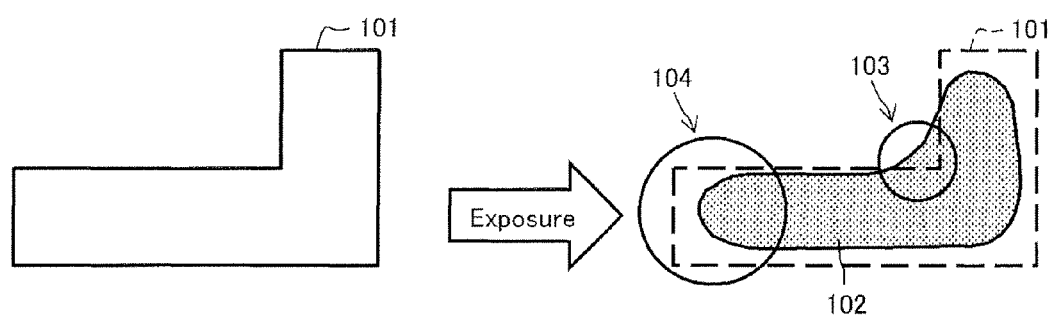
FIGS. 1A and 1B show a relationship between the shape of a photomask in a photolithography process and the shape of a circuit pattern formed by using the photomask.
Figure 1B:
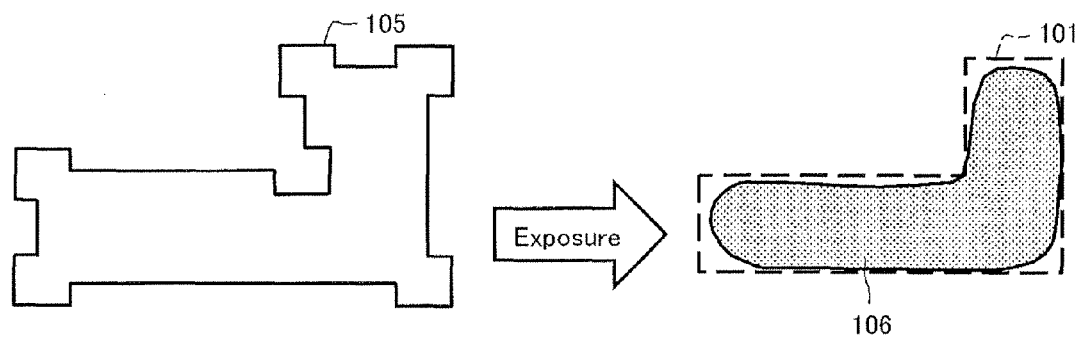
Figure 2B:
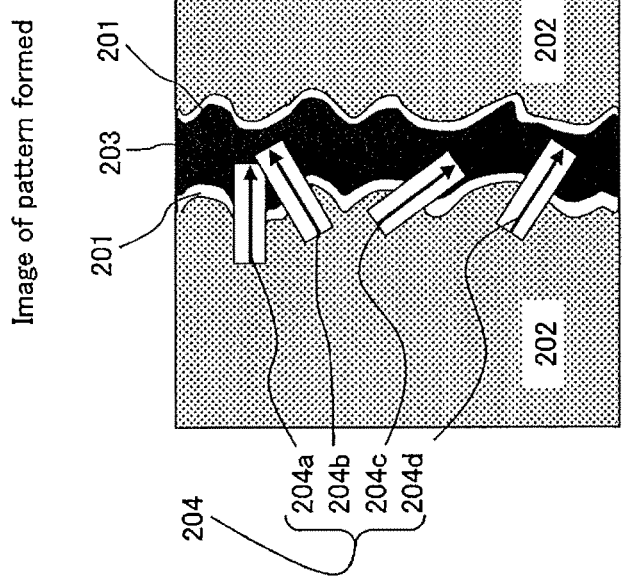
FIGS. 2A and 2B show an outline of processing for determining the position of the contour of a circuit pattern.
Figure 2A:
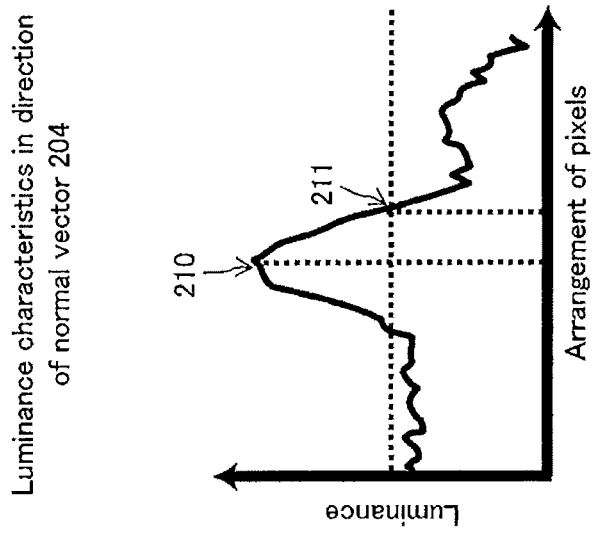

In step S301, the image contour of a circuit pattern formed is acquired. More specifically, the image contour of a circuit pattern is extracted from data on an image captured by the CD-SEM. Applicable image contour extraction techniques include those insusceptible to the effects of image noise and contrast and capable of extracting a continuous image contour. Examples of such techniques may be extraction techniques that use a LOG (Laplacian of Gaussian) filter and a Canny filter described in a known literature (Okutomi et al, Digital image processing, CG-ARTS Association, 2004), as well as a pattern inspection technique disclosed in Japanese Unexamined Patent Application Publication No. 2006-351888. In this technique, more specifically, the image data of FIG. 2A is scanned in directions across the boundary between the respective regions 202 without the circuit pattern and the region 203 with the circuit pattern to measure the luminance values and determine the positions of pixels each with the maximum luminance value serving as the white-band centers 210 as shown in FIG. 2B, followed by connecting the white-band centers 210 to form a line which is acquired as the image contour.

In step S302, the shape of the design data is classified into shape structures as described later. Here, brief description will be made with reference to FIGS. 4A and 4B.

As shown in FIG. 4A, design data 401, 402 are closed polygons (hereinafter referred to also as design polygons with their Reference Numerals omitted). The design data 401 is a wiring pattern or the like. The design data 402 is a hole (a contact hole, a via hole, or the like) for connecting transistors or wiring layers to each other. The design data 402 is hereinafter referred to as a "hole".

FIG. 4B shows shape structures as constituents of design data 401a, 402a. The shape structures are a LINE (a line segment), a CORNER, and an EOL (End Of Line). As shown in FIG. 4B, the design data 401a is represented as a combination of LINEs 407, CORNERs 408, and EOLs 406. A hole 402a is represented as a combination of LINEs 407 and CORNERs 408.

Figure 5:
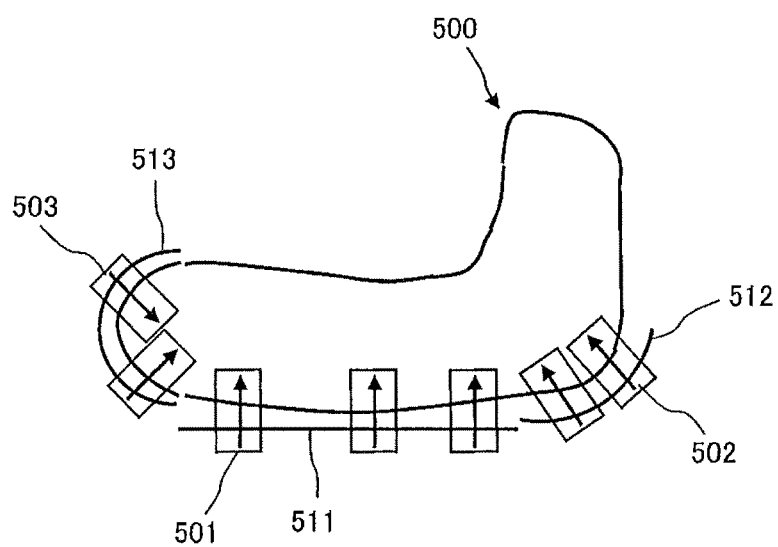
FIG. 5 shows normal vectors for each shape structure.

Referring back to FIG. 3, in step S303, normal vectors are calculated for each shape structure. More specific description will be made with reference to FIG. 5. FIG. 5 shows the image contour of a circuit pattern 500 formed.

In step S303, first, approximation curves 511, 512, 513 (smooth approximation lines) are determined that have shapes close to those of corresponding portions of the image contour. The LINE is represented as the approximation curve 511 by a line segment. For the CORNER and the EOL, the least squares method is used to calculate polynomial curves (denoted by Reference Numerals 512, 513) respectively fitting a vertex of the CORNER and vertices of the EOL. Then, normal vectors 501, 502, 503 indicative of the normal directions to the approximation curves are calculated. The normal vectors 501, 502, 503 may not be equal in length to each other as long as they are long enough to cross the image contour (more specifically, long enough to enable detection of the position on the contour 211 as mentioned in FIG. 2B that shows the luminance characteristics). For the hole, the image contour thereof is represented by an ellipse, and thus an approximation curve is calculated on the basis of data on the size and coordinates position of the hole by using an optimization technique such as the least squares method and then normal vectors to the calculated approximation curve are calculated.

Referring back again to FIG. 3, in step S304, the shape structures are mapped to the image contour. The processing is to determine which one of the portions of the image contour acquired in step S301 rcorresponds to which one of the LINE, CORNER and EOL as the shape structures. Step S304 will be detailed later.

In step S305, the position of the SEM contour is determined by using the normal vectors calculated in step S303. More specifically, the luminance values of the pixels as the white-band centers 210 that form the image contour are multiplied by a given factor to obtain luminance values of the pixels at positions on the contour 211, as shown in FIG. 2B, and the positions on the contour 211 are connected to form a line which is put as the SEM contour. Step S305 will be detailed later.

As described above, in the present invention, the procedure of FIG. 3 is performed to determine the position of the SEM contour.

(Configuration of Pattern Measuring Apparatus)

Figure 6:
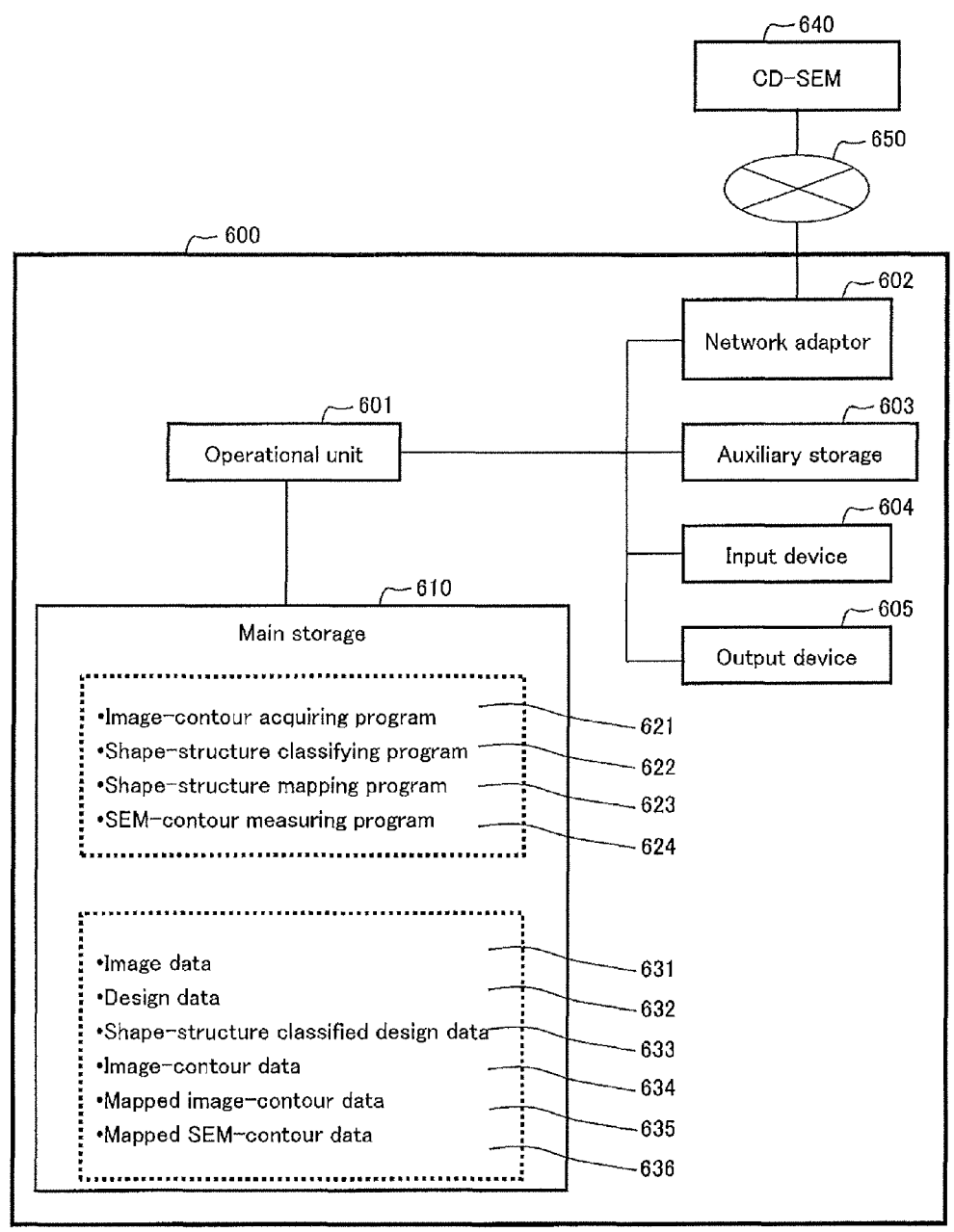
FIG. 6 shows an example of a configuration of a pattern measuring apparatus according to the first embodiment.

With reference to FIG. 6, description will be made of the configuration of a pattern measuring apparatus according to the first embodiment.

As shown in FIG. 6, a pattern measuring apparatus 600 includes an operational unit 601, a main storage 610, a network adaptor 602, an auxiliary storage 603, an input device 604, and an output device 605. The network adaptor 602 is connected via a network 650 to a CD-SEM 640 to receive image data from the CD-SEM 640. The auxiliary storage 603 includes an HDD (Hard Disk Drive), an SSD (Solid State Drive) and the like. The input device 604 includes a trackball, a keyboard, a scanner, a BD-RE D (Blu-ray Disc Recordable Drive [Blu-ray is a trademark]) and the like. The output device 605 includes a display, a printer, a BD-RE D and the like.

The operational unit 601 is a CPU (Central Processing Unit) of a computer, and realizes various functions by executing programs developed on the main storage 610 including a DRAM (Dynamic Random Access Memory).

The main storage 610 has stored therein an image-contour acquiring program 621, a shape-structure classifying program 622, a shape-structure mapping program 623, and an SEM-contour measuring program 624. The main storage 610 has stored therein image data 631, design data 632, shape-structure classified design data 633, image-contour data 634, mapped image-contour data 635, and mapped SEM-contour data 636. Various programs and data are exchanged and kept consistent between the main storage 610 and the auxiliary storage 603 and stored therein.

The image-contour acquiring program 621 executes step S301 of FIG. 3. In the processing of the image-contour acquiring program 621, the image data 631 is acquired from the CD-SEM 640 via the network 650 and stored into the auxiliary storage 603. Note that the image data 631 is represented by the coordinates of the pixels and the luminance value of the pixels at those coordinates, and, during the execution of step S301, a duplicate is made from the image data 631 stored in the auxiliary storage 603 and sent into the main storage 610. Then, the image-contour acquiring program 621 executes the image contour extraction, generates the image-contour data 634, and stores the generated image-contour data 634 into the main storage 610 or the auxiliary storage 603.

Applicable image contour extraction techniques include those insusceptible to image noise and contrast and capable of extracting a continuous image contour. Examples of such techniques may be extraction techniques that use a LOG (Laplacian of Gaussian) filter and a Canny filter described in a known literature (Okutomi et al, digital image processing, CG-ARTS Association, 2004), as well as a pattern inspection technique disclosed in Japanese Unexamined Patent Application Publication No. 2006-351888.

The shape-structure classifying program 622 executes step S302 and step S303 of FIG. 3. The shape-structure classifying program 622 reads out the design data 632 pre-stored in the auxiliary storage 603, duplicates the design data 632 and stores the duplicate in the main storage 610, and classifies the design data 632 into shape structures. After that, the shape-structure classifying program 622 generates shape-structure classified design data 633 (denoted by Reference Numerals 401a and 402a in FIG. 4B) and normal vectors, which are then stored into the main storage 610 or the auxiliary storage 603.

The shape-structure mapping program 623 executes step S304 of FIG. 3. The shape-structure mapping program 623 executes the processing in step S304 by using the image-contour data 634 and the shape-structure classified design data 633 to generate the mapped image-contour data 635 (denoted by Reference Numeral 1202 in FIG. 12), and stores the generated mapped image-contour data 635 into the main storage 610 or the auxiliary storage 603.

The SEM-contour measuring program 624 executes step S305 of FIG. 3. The SEM-contour measuring program 624 executes the processing in step S305 by using the image data 631, the shape-structure classified design data 633, the mapped image-contour data 635 and the normal vectors to generate the mapped SEM-contour data 636, and stores the generated mapped SEM-contour data 636 into the main storage 610 or the auxiliary storage 603.

(Procedure of Classification of Design data into Shape-structures)

Figure 7:
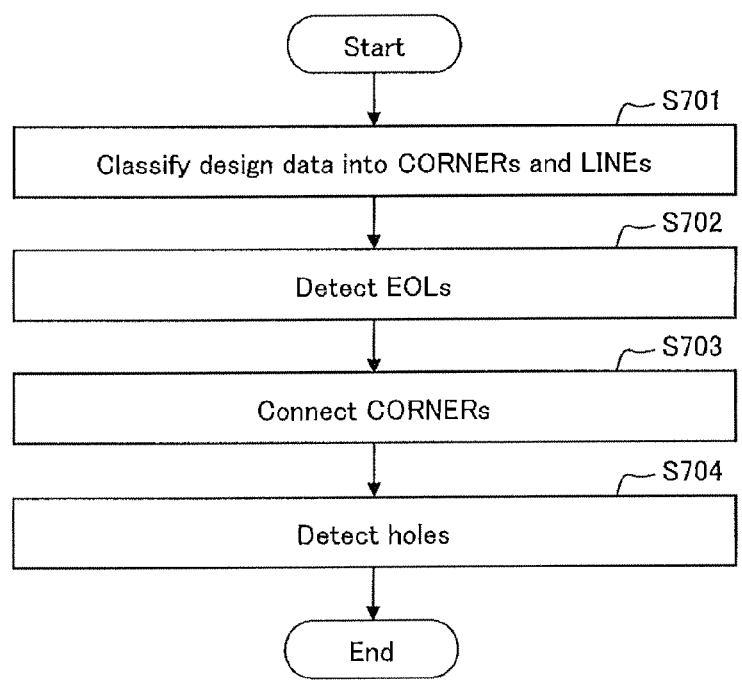
FIG. 7 shows details of processing in step S302 of FIG. 3.

With reference to FIG. 7, description will be made of a flow of processing executed by the shape-structure classifying program 622. The flow of processing in FIG. 7 shows the details of the processing in step S302 of FIG. 3.

In step S701, the design data is classified into CORNERs and LINEs.

Figure 8A:
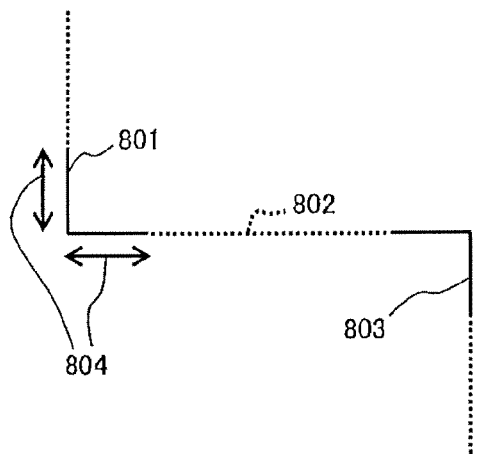
FIGS. 8A and 8B show processing for classifying design data into CORNERs and LINEs.

First, description will be made of a part 404 of a design polygon shown in FIG. 4A with reference to FIG. 8A. A CORNER 801 is detected as a range of CORNER lengths 804 extending from a vertex of the design polygon. A CORNER 803 is detected in the same manner. The parts other than the CORNERs 801 and 803 are detected as LINEs 802 (shown in dotted lines).

If the length of a line segment between the vertices at the ends is shorter than the twice the CORNER length 804, the lengths to the middle of the line segment are regarded as being included within the respective ranges of CORNERs, which are referred to as CORNERs 811, 812.

Referring back to FIG. 7, in step S702, EOLs are detected.

Figure 9A:
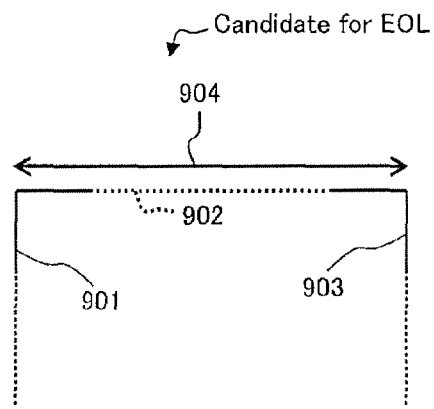
FIGS. 9A and 9B show processing for detecting an EOL from design data.
Figure 9B:
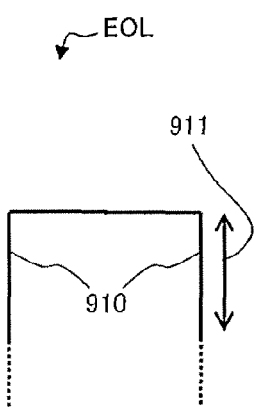

First, with reference to FIG. 9A, description will be made on a part 403 of the design polygon shown in FIG. 4A. As shown in FIG. 9A, a line end (U-shaped portion) constituted of two line segments and one line segment crossing the two line segments is detected as a candidate for an EOL. In other words, the candidate for an EOL is constituted of two CORNERs 901, 903 and one LINE 902 and satisfies a condition that the distance between the adjacent vertices is equal to or smaller than a threshold value 904. Next, as shown in FIG. 9B, if the candidate for an EOL has feet 910 the lengths of which are equal to or greater than a threshold value 911, the CORNERs 901, 903 and the LINE 902 are connected to each other and detected as a single EOL. If the feet 910 of the candidate for an EOL are shorter than the threshold value 911, the CORNERs 901, 903 and the LINE 902 are not connected to each other.

Next, in step S703, CORNERs are connected to each other.

Figure 8B:
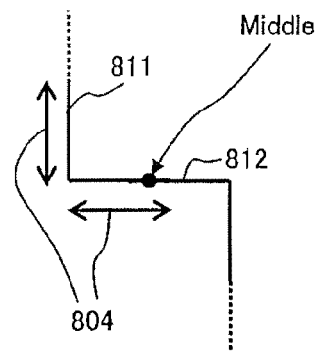

For example, as shown in FIG. 8B, if there is no LINE between the two CORNERs 811, 812, the CORNERs 811, 812 are connected to each other and detected as a single CORNER. In FIG. 8B, the CORNER is hook-shaped. The CORNER, however, may be U-shaped as is the candidate for an EOL shown in FIG. 9A.

In step S704, holes are detected.

If the design polygon has a size and an aspect ratio each within a range of threshold values, the design polygon is detected as a hole. However, even if the design polygon is detected as a hole, steps S701-703 are executed so that as shown in FIG. 4B, the hole 402a is classified into the CORNERs 408 and the LINEs 407 to generate the shape-structure classified design data 633.

(Procedure of Shape Mapping)

Figure 10:
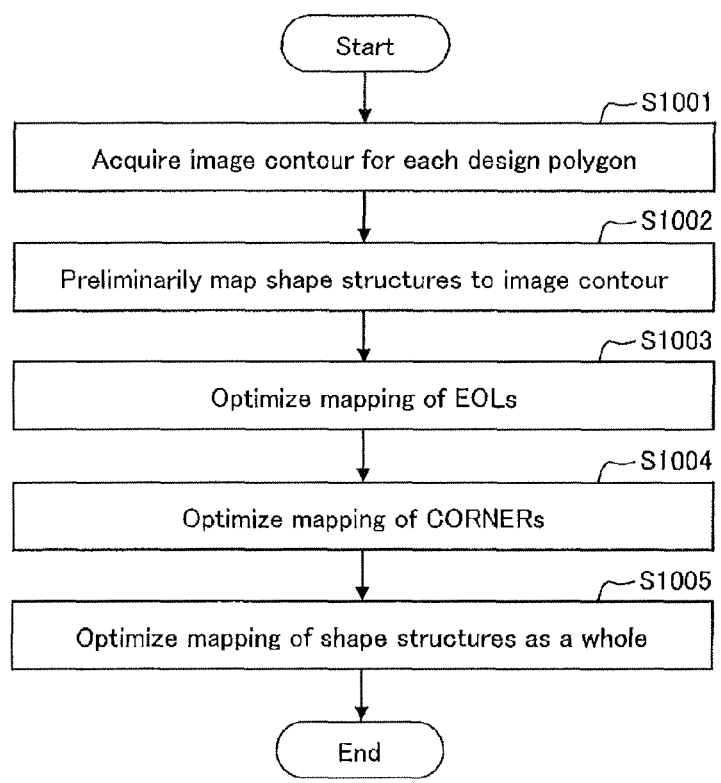
FIG. 10 shows details of processing in step S304 of FIG. 3.

With reference to FIG. 10, description will be made of a flow of processing executed by the shape-structure mapping program 623. The flow of processing in FIG. 10 shows the details of the processing in step S304 of FIG. 3.

In step S1001, the above-described processing of extracting the image contour is performed to acquire the image contour for each design polygon. The positional relation between the design data and the image contour is able to be determined by an ICP (Iterative Closest Point) method and a method disclosed in Japanese Unexamined Patent Application Publication No. 2006-351888.

In step S1002, the shape structures are preliminarily mapped to the image contour. How the preliminary mapping is performed will be described more specifically by way of example with reference to FIG. 11.

Figure 11:
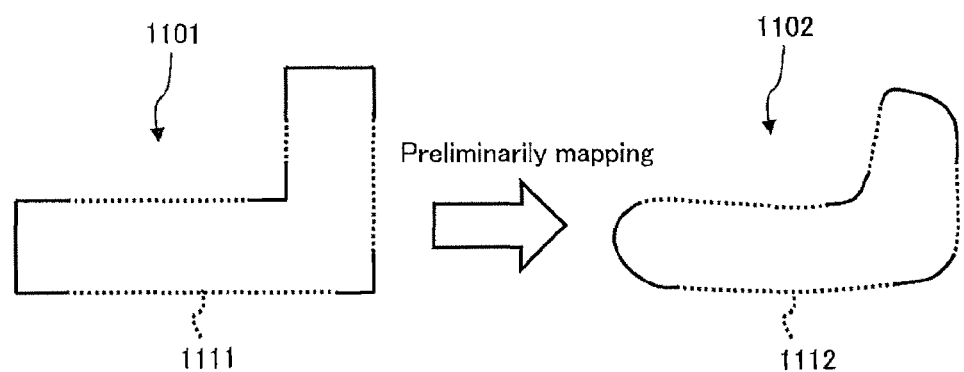
FIG. 11 shows details of processing in step S1002 of FIG. 10.

As shown on the left side of FIG. 11, the contour shape of the design data 1101 is already classified into shape structures. Then, the shape structures are preliminarily mapped to the image contour 1102 shown on the right side of FIG. 11 in such a manner that no gap is formed between the adjacent preliminarily mapped shape structures and that the order of the shape structures before preliminary mapping is maintained. More specifically, the shape structures are preliminarily mapped to the image contour 1102 by arranging sections on the image contour, without any gap between the adjacent sections, in such a positional relation with each other as to form a same shape as the contour shape of the design data with the circumferential ratio of each section to the image contour being equal to the circumferential ratio of the corresponding shape structure to the design data. Thus, in FIG. 11, the LINEs 1112 are preliminarily mapped to the image contour 1102 in such a manner that, for example, the circumferential ratio of the LINE 1112 to the image contour 1102 is equal to the circumferential ratio of the LINE 1111 to the design data 1101.

The preliminary mapping positions of the shape structures on the image contour 1102 are each determined by finding a normal direction to the image contour 1102, that is a direction to align to one of the normal vectors calculated in step S303 shown in FIG. 3, and then moving the shape structure so that the normal direction is aligned to the normal vector. Multiple normal directions may be aligned to corresponding normal vectors if there are found such normal vectors, in order to determine the position of each shape structure.

Note that after the completion of step S1002, processing in step S304 in FIG. 3 may be ended without steps S1003-S1005 performed.

Referring back to FIG. 10, in step S1003, the EOL structure mapping is optimized.

Figure 12:
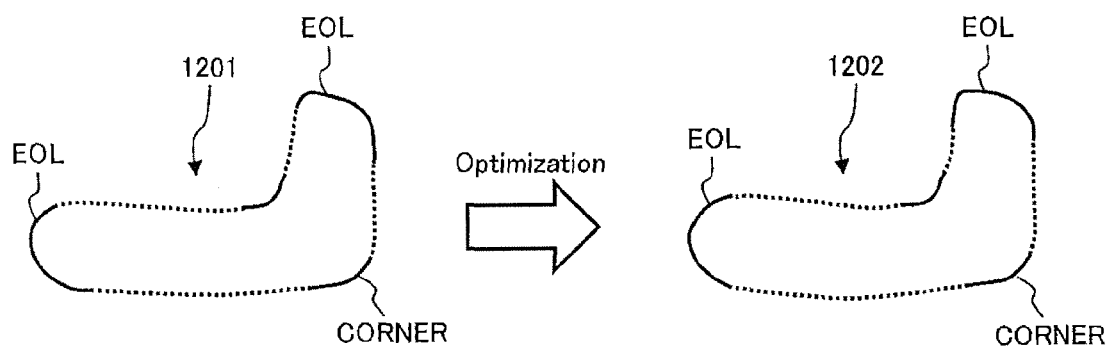
FIG. 12 shows optimization of mapping.

At the completion of step S1002, as shown in the figure on the left side of FIG. 12, the preliminary mapping position of the EOL on an image contour 1201 may potentially be displaced. In order to reduce the geometric differences between the respective shape structures and respective corresponding portions of the image contour, the mapping length and position are optimized. More specifically, first, a polynomial curve which, in terms of statistical criteria, fits the vertices constituting each EOL of the design polygon is calculated. Next, a section of the image contour 1201 which fits the polynomial curve in terms of statistical criteria is extracted. In this manner, the results of the preliminary EOL mapping are corrected to obtain the image contour 1202 shown on the right side of FIG. 12. Examples of the statistical criteria used for the calculation of the polynomial curve include difference minimality, likelihood, AIC (Akaike's Information Criterion), and MDL (Minimum Description Length).

In step S1004, the CORNER mapping is optimized.

At the completion of step S1002, as shown in the figure on the left side of FIG. 12, the preliminary mapping position of the CORNER on the image contour 1201 may potentially be displaced. In order to reduce the geometric differences between the shape structure and the image contour, the mapping length and position are optimized. More specifically, first, a polynomial curve which, in terms of statistical criteria, fits the vertex constituting each CORNER of the design polygon is calculated. Next, a section of the image contour 1201 which fits the polynomial curve in terms of the statistical criteria is extracted. In this manner, the results of the preliminary CORNER mapping are corrected to obtain the image contour 1202 shown on the right side of FIG. 12. Examples of the statistical criteria used for the calculation of the polynomial curve include difference minimality, likelihood, AIC (Akaike's Information Criterion), and MDL (Minimum Description Length).

In step S1005, the mapping of all the shape structures is optimized.

At the completion of step S1004, the shape structures as a whole are not optimized. The values of the coordinates of the position and length of each of the LINEs, CORNERs and EOLs are slightly altered repeatedly, assuming those at the completion of S1004 as initial values, based on the Metropolis-Hastings algorithm in the Markov chain monte carlo method, to obtain values that depend on statistical criteria, and, by using the values, optimize the mapping to the entire image outline. Examples of the statistical criteria used for the calculation of the polynomial curve include difference minimality, likelihood, AIC (Akaike's Information Criterion), and MDL (Minimum Description Length).

(Procedure of SEM Contour Measurement)

Figure 13:
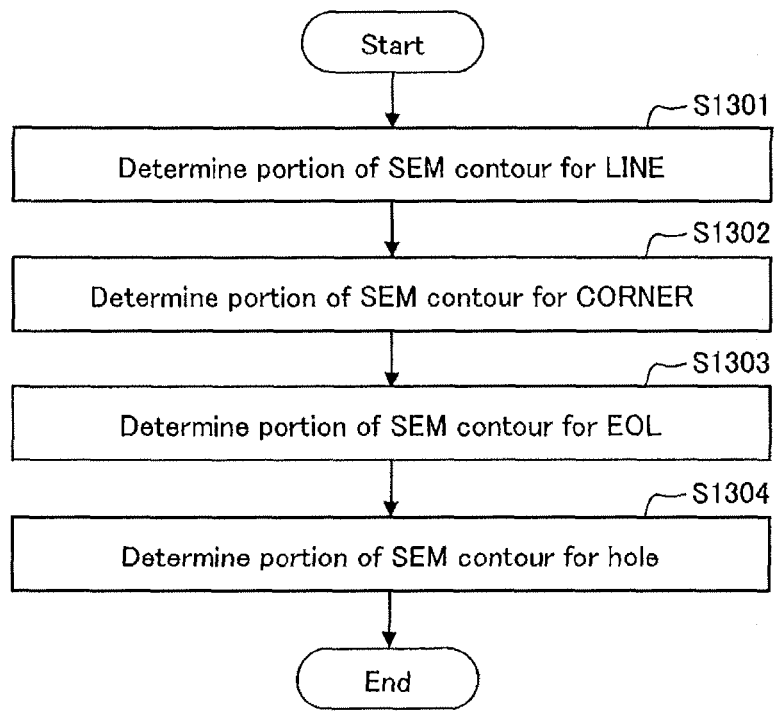
FIG. 13 shows an example of a flow of processing for determining a SEM contour.

With reference to FIG. 13, description will be made of a flow of processing executed by the SEM-contour measuring program 624. The flow of processing in FIG. 13 shows the details of the processing in step S305 of FIG. 3.

In step S1301, a portion of the SEM contour for the LINE is determined.

First, at the completion of step S303 in FIG. 3, the normal vectors are already calculated for each shape structure. In step S304 in FIG. 3, the shape structures are mapped to the image contour, so that the normal vectors are able to be determined from the mapped shape structures.

Figure 14:
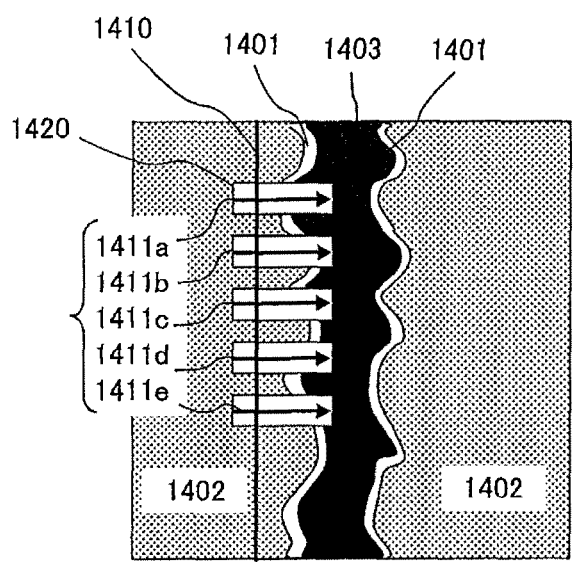
FIG. 14 shows an example of normal vectors used in determining a portion of the SEM contour for a shape structure which is a LINE.

Description will be made of the processing of determining the SEM contour by using, as a specific example, the image data on a pattern formed shown in FIG. 14. In FIG. 14, Reference Numeral 1401 denotes a white band, Reference Numeral 1402 denotes a region without the circuit pattern, and Reference Numeral 1403 denotes a region with the circuit pattern. The image contour of the image data of FIG. 14 is found to be the LINE as a shape structure by the processing in step S304 in FIG. 3, so that a LINE (approximation curve) 1410 is used. Then, the normal vectors (1411a-1411e) to the LINE 1410 are set. FIG. 14 shows measurement boxes 1420 each containing the normal vector 1411a. The measurement boxes 1420 each have the shape of a rectangle with long sides in the direction of the normal vector 1411a and short sides as a width crossing the long sides at a right angle. The measurement box 1420 contains one or more normal vectors set to reduce noise in the image captured by the CD-SEM. If the measurement box 1420 contains multiple normal vectors, luminance values of pixels are averaged in the direction of the multiple normal vectors. Then, a maximum luminance value of the obtained averaged luminance values is put as 100%, and a minimum luminance value of the calculated averaged luminance values is put as 0%. The maximum luminance values are multiplied by a given factor to determine coordinates of pixels with luminance values thus obtained as the coordinates of the SEM contour.

Figure 15:
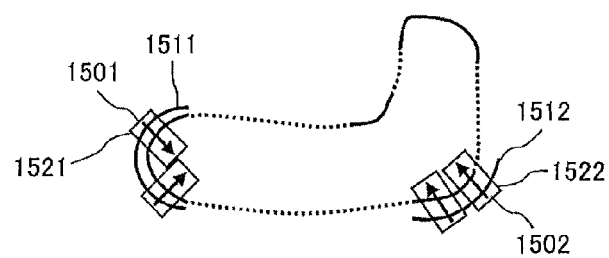
FIG. 15 shows an example of normal vectors used in determining a portion of the SEM contour for each of shape structures which are an EOL and a CORNER.

Referring back to FIG. 13, in step S1302, a portion of the SEM contour for the CORNER is determined. More specifically, as shown in FIG. 15, in step S303 of FIG. 3, an approximation curve 1512 corresponding to the CORNER is already calculated and normal vectors 1502 are already calculated. Thus, the measurement boxes 1522 are set so that they respectively contain the normal vectors 1502, and then, as in step S1301, the position of the portion of the SEM contour is calculated.

In step S1303, a portion of the SEM contour for the EOL is determined. More specifically, as shown in FIG. 15, in step S303 of FIG. 3, an approximation curve 1511 corresponding to the EOL is already calculated and normal vectors 1501 are already calculated. Thus, the measurement boxes 1521 containing the non al vectors 1501 are set, and then, as in step S1301, the position of the portion of the SEM contour is calculated.

In step S1304, the SEM contour of the hole is determined. More specifically, as shown in FIG. 15, in step S302 of FIG. 3, an approximation curve corresponding to the hole is already calculated and normal vectors are already calculated. Thus, the measurement boxes containing the normal vectors are set, and then, as in step S1301, the position of the SEM contour is calculated.

Note that the width of each measurement box may be properly changed according to the position and size of the shape structure, which will be described more specifically by way of example with reference to FIGS. 16A and 16B.

Figure 16A:
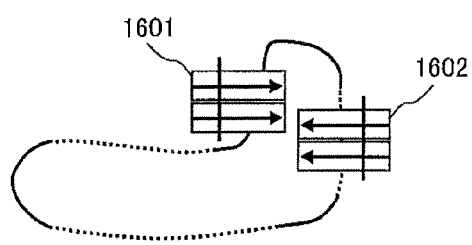
FIGS. 16A and 16B show an example in which the interval between normal vectors is changed properly.
Figure 16B:
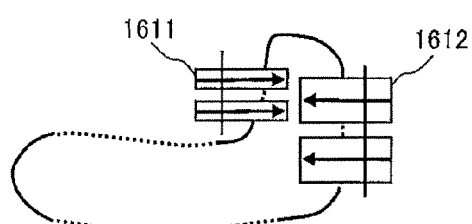

In FIG. 16A, the measurement boxes set in the mapped LINE have the same width. In FIG. 16B, the measurement boxes have different widths according to the length of a LINE for which each measurement box is set.

If the positions and sizes of the measurement boxes are the same as shown in FIG. 16A, the width of the measurement box runs over the end of the adjacent EOL or CORNER if the measurement box is set for a LINE of a short length as is the case of a measurement box 1601. This results in reduced calculation accuracy in the SEM contour. However, by setting a smaller width for a measurement box 1611 because the measurement box is set for a LINE of a shorter length and by setting a wider width for a measurement box 1612 because the measurement box 1612 is set for a LINE of a greater length as shown in FIG. 16B, and by setting smaller widths for measurement boxes that are set for a CORNER or a EOL, it is possible to reduce the displacement of the normal vectors contained in the measurement boxes from the normal directions to the corresponding curve, and consequently improve the calculation accuracy of the SEM contour. In the case where the width of the measurement box is increased, it is possible to increase the number of the normal vectors (the number of scans) used for calculation of the SEM contour.

As described above, in the first embodiment, as shown in FIG. 3, the design data is classified into shape structures (step S302), normal vectors are calculated for each shape structure (step S303), the shape structures are mapped to the image contour (step S304), and, by using the normal vectors for the shape structures mapped to the image contour, the position of the SEM contour is determined (step S305). Thus, even if the image contour of a formed circuit pattern is roughened (meanders), it is possible to stabilize the normal directions, and consequently, determine the position of the SEM contour of the circuit pattern for a semiconductor device with high accuracy.

It is possible to convert design data with OPC back to design data without OPC once before the procedure of the first embodiment is carried out.

Further, it is possible to exchange the orders of step S303 and step S304 in FIG. 3.

(Second Embodiment)

In the first embodiment, in step S302 in FIG. 3, the design data without OPC is classified into shape structures. In a second embodiment, design data with OPC (hereinafter referred to as OPC design data) is classified into shape structures, which will be described with reference to FIG. 17. In the following paragraphs, to be distinguished from the LINE, the CORNER, and the EOL in the first embodiment, corresponding components are referred to as the OPC-LINE, the OPC-CORNER, and the OPC-EOL. Detailed description on step S301 and steps S303-S305 in FIG. 3 will be omitted since it is already made in the section of the first embodiment.

Figure 17:
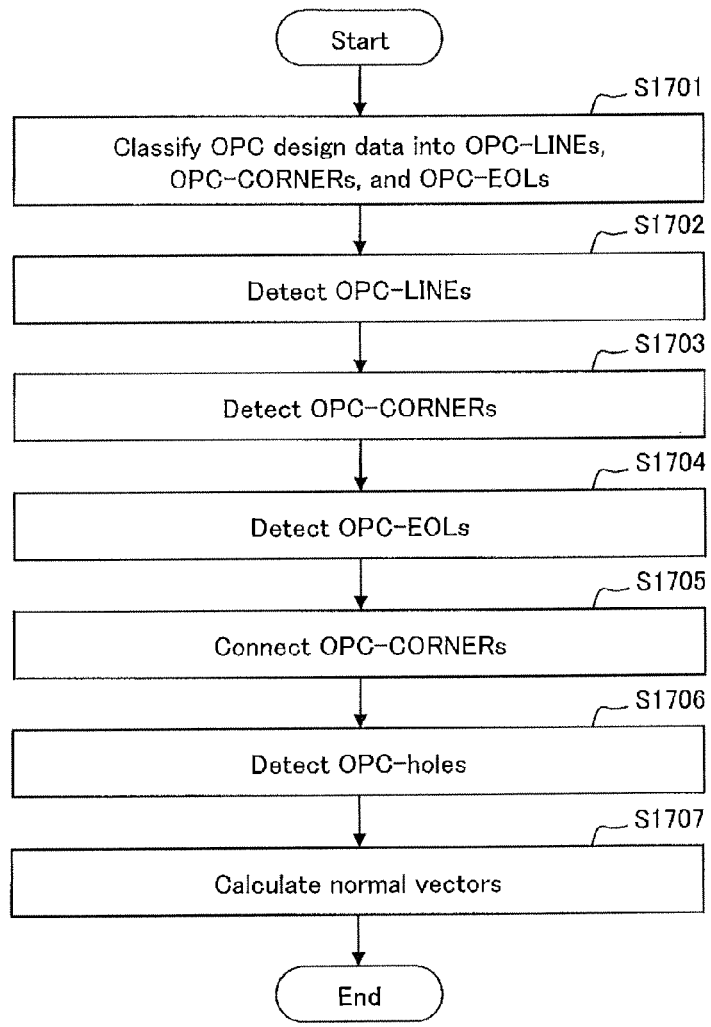
FIG. 17 shows an example of a flow of processing for measuring a circuit pattern according to a second embodiment.

As shown in FIG. 17, in step S1701, the OPC design data is classified into shape structures as the OPC-LINE, the OPC-CORNER, and the OPC-EOL, which will be described more specifically with reference to FIGS. 18A and 18B.

Figure 18A:
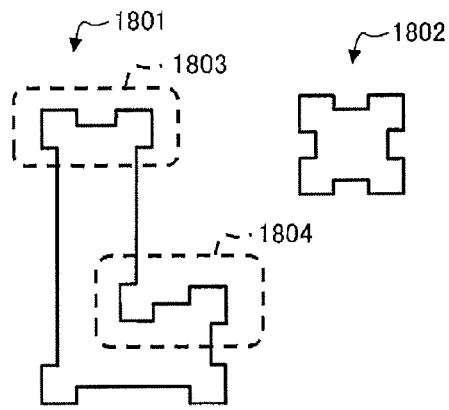
FIGS. 18A and 18B show OPC design data and shape structures.

FIG. 18A shows OPC design data 1801, 1802 referred to as design polygon. The OPC design data 1801 represents a wiring pattern or the like. The OPC design data 1802 represents a hole.

Figure 18B:
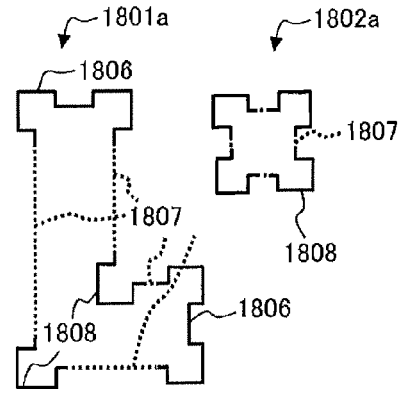

FIG. 18B shows shape structures as constituents of OPC design data 1801a, 1802a. The shape structures are an OPC-LINE, an OPC-CORNER, and an OPC-EOL. As shown in FIG. 18B, the OPC design data 1801a is represented as a combination of OPC-LINEs 1807, OPC-CORNERs 1808, and OPC-EOLs 1806. The OPC-HOLE 1802a is represented as a combination of OPC-LINEs 1807 and OPC-CORNERs 1808.

Here, with reference to FIGS. 19A and 19B, description will be made on how to treat a step formed by the OPC process (hereinafter referred to as the OPC bump). The shape shown in FIGS. 19A and 19B is obtained by enlarging a portion denoted by Reference Numeral 1804 in FIGS. 18A and 18B.

Figure 19A:
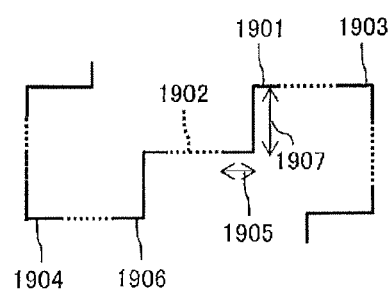
FIGS. 19A and 19B show how shape structures are detected in OPC design data.
Figure 19B:
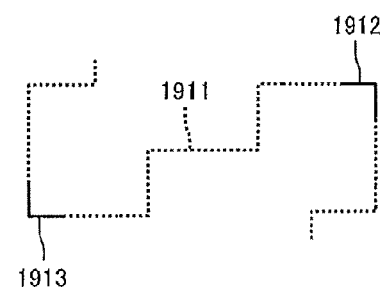

With reference to FIG. 19A, description will be made on how to distinguish the OPC-CORNER from the OPC bump. The OPC bump is a hook-shaped portion (step) denoted by Reference Numeral 1901 or Reference Numeral 1906 shown by the solid line. The OPC-CORNER is preliminarily defined as a portion with a length denoted by Reference Numeral 1905 extending from a vertex of the OPC-CORNER. The length dented by Reference Numeral 1905 is a half the length denoted by Reference Numeral 1907 when the line segment between the vertices of the OPC bump. The shape structures other than the OPC-CORNERs are detected as the OPC-LINEs (for example, one denoted by Reference Numeral 1902).

If the line segment between the adjacent vertices is shorter than the length denoted by Reference Numeral 1907, the length to the middle of the line segment is regarded as being included within the range of an OPC-CORNER. If there is no OPC-LINE between the adjacent two OPC-CORNERs, these OPC-CORNERs are connected to each other and detected as the OPC bump 1901 or 1906. The section detected as an OPC bump is not regarded as an OPC-CORNER in step S1701 and the steps thereafter.

Referring back to FIG. 17, in step S1702, the OPC-LINE is detected, which will be described more specifically by way of example with reference to FIGS. 19A and 19B.

If an OPC bump and an OPC-LINE are adjacent to each other as in the case of the OPC bump 1901 and the OPC-LINE 1902 or as in the case of the OPC-LINE 1902 and the OPC bump 1906 shown in FIG. 19A, the OPC bump and the OPC-LINE are connected to each other and detected as a single OPC-LINE 1911 shown by the dotted line in FIG. 19B.

In step S1703, the OPC-CORNER is detected, which will be described more specifically by way of example with reference to FIGS. 20A and 20B.

Figure 20A:
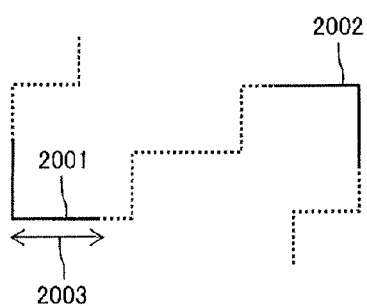
FIGS. 20A and 20B show how to determine whether or not a shape structure is OPC-CORNER.
Figure 20B:
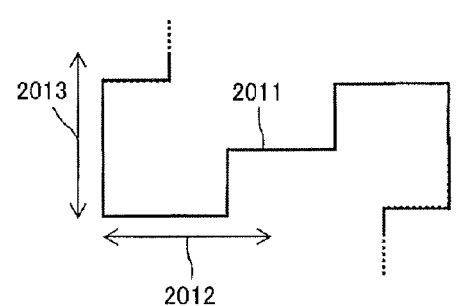

In FIG. 20A, the result of step S1702 (see FIG. 19B) is assumed as the start of the processing. The final CORNER length (denoted by Reference Numeral 2003) is defined, and the length of the shape structure determined as the OPC-CORNER in step S1702 is extended from the length denoted by Reference Numeral 1905 shown in FIG. 19A to the length denoted by Reference Numeral 2003 (CORNER length). The result is shown by Reference Numerals 2001, 2002 in FIG. 20A.

If the line segment between the vertices of the adjacent OPC-CORNERs is shorter than the CORNER length, the length to the middle of the line segment is regarded as being included within the range of the OPC-CORNER.

In step S1704, the OPC-EOL is detected, which will be described more specifically by way of example with reference to FIGS. 21A and 21B. The shape shown in FIGS. 21A and 21B is obtained by enlarging a portion denoted by Reference Numeral 1803 in FIGS. 18A and 18B.

Figure 21A:
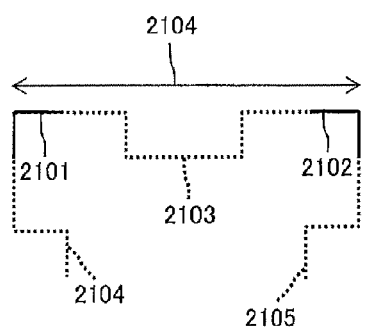
FIGS. 21A and 21B show how to determine whether or not a shape structure is an OPC-EOL or an OPC-CORNER.
Figure 21B:
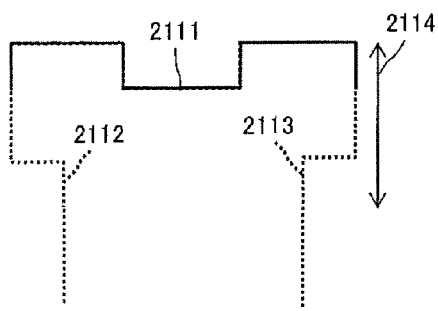

As shown in FIG. 21A, a candidate for an OPC-EOL is constituted of an OPC-CORNER 2101, an OPC-LINE 2103, an OPC-CORNER 2102, an OPC-LINE 2104, and an OPC-LINE 2105. If the length between the vertices of the adjacent OPC-CORNER 2101 and OPC-CORNER 2102 (denoted by Reference Numeral 2104) is equal to or smaller than a threshold value, the two OPC-CORNER 2101 and OPC-CORNER 2102, and the OPC-LINE 2103 therebetween are connected to each other to form a shape denoted by Reference Numeral 2111 (solid line) shown in FIGS. 21A and 21B.

Next, the shape denoted by Reference Numeral 2111 is extended by adding thereto feet (denoted by Reference Numerals 2112, 2113), namely, the shape 2111 and the feet 2112, 2113 are connected to each other, if the feet are able to have a length denoted by Reference Numeral 2114. Then, the shape 2111 and the feet 2112, 2113 are detected as an OPC-EOL. However, if the feet are unable to have the length denoted by Reference Numeral 2114, the connection of the shape 2111 is cancelled so that the shape 2111 is reverted to the OPC-CORNERs 2101, 2102 and the OPC-LINE 2103 shown in FIG. 21A.

In step S1705, the OPC-CORNERs are connected. In this step, in the case where there are no OPC-LINE between the two OPC-CORNERs that are detected in step S1703, these OPC-CORNERs are connected to each other to form a single OPC-CORNER.

The above processing will be described more specifically by way of example with reference to FIGS. 20A and 20B. If, for example, OPC-CORNERs 2001, 2002 as shown in FIG. 20A have CORNER lengths denoted by Reference Numerals 2012 and 2013 shown in FIG. 20B, there is no OPC-LINE (dotted line) between the OPC-CORNERs 2001, 2002. Thus, the OPC-CORNERs 2001, 2002 in FIG. 20A are connected to each other so as to be detected as an OPC-CORNER 2011 (solid line) shown in FIG. 20B.

In step S1706, the OPC-HOLE is detected. If a design polygon has a size and aspect ratio within a range of threshold values, the design polygon is detected as an OPC-HOLE (see Reference Numeral 1802a in FIG. 18B). Even if the design polygon is determined as the OPC-HOLE, steps S1701-S1705 are performed to classify the design polygon into OPC-CORNERs 1808 and OPC-LINEs 1807 as shown in the hole 1802a in FIG. 18B to generate the shape-structure classified design data 633.

In step S1707, the normal vectors are calculated. More specifically, the normal vectors are calculated for the OPC-LINE, the OPC-CORNER, and the OPC-EOL which are the shape structures detected in steps 1702-S1705. For example, in the case of the OPC-LINE, a straight line that fits the vertices constituting the OPC-LINE as the design polygon is calculated by using the least squares method, followed by calculating normal directions to the thus obtained straight line to obtain the normal vectors. In the case of the OPC-CORNER and the OPC-EOL, a polynomial curve that fits the vertices constituting each of the shape structures of the design polygon is calculated by using the least squares method, followed by calculating normal direction to the polynomial curve to obtain the normal vectors.

As described above, in the second embodiment, as shown in FIG. 17, the OPC-LINE, the OPC-CORNER, the OPC-EOL, and the OPC-HOLE are detected as the shape structures by distinguishing the OPC bump from the OPC-CORNER. Then, the normal vectors are calculated for each shape structure. Thus, even if the image contour of a formed circuit pattern is roughened (meanders), it is possible to stabilize the normal directions, and consequently, as in the first embodiment, determine the position of the SEM contour of the circuit pattern for a semiconductor device with high accuracy.

(Modification 1)

In the first and second embodiments, one CD-SEM image data item is used, whereas, in Modification 1, multiple CD-SEM image data items are used.

Figure 22:
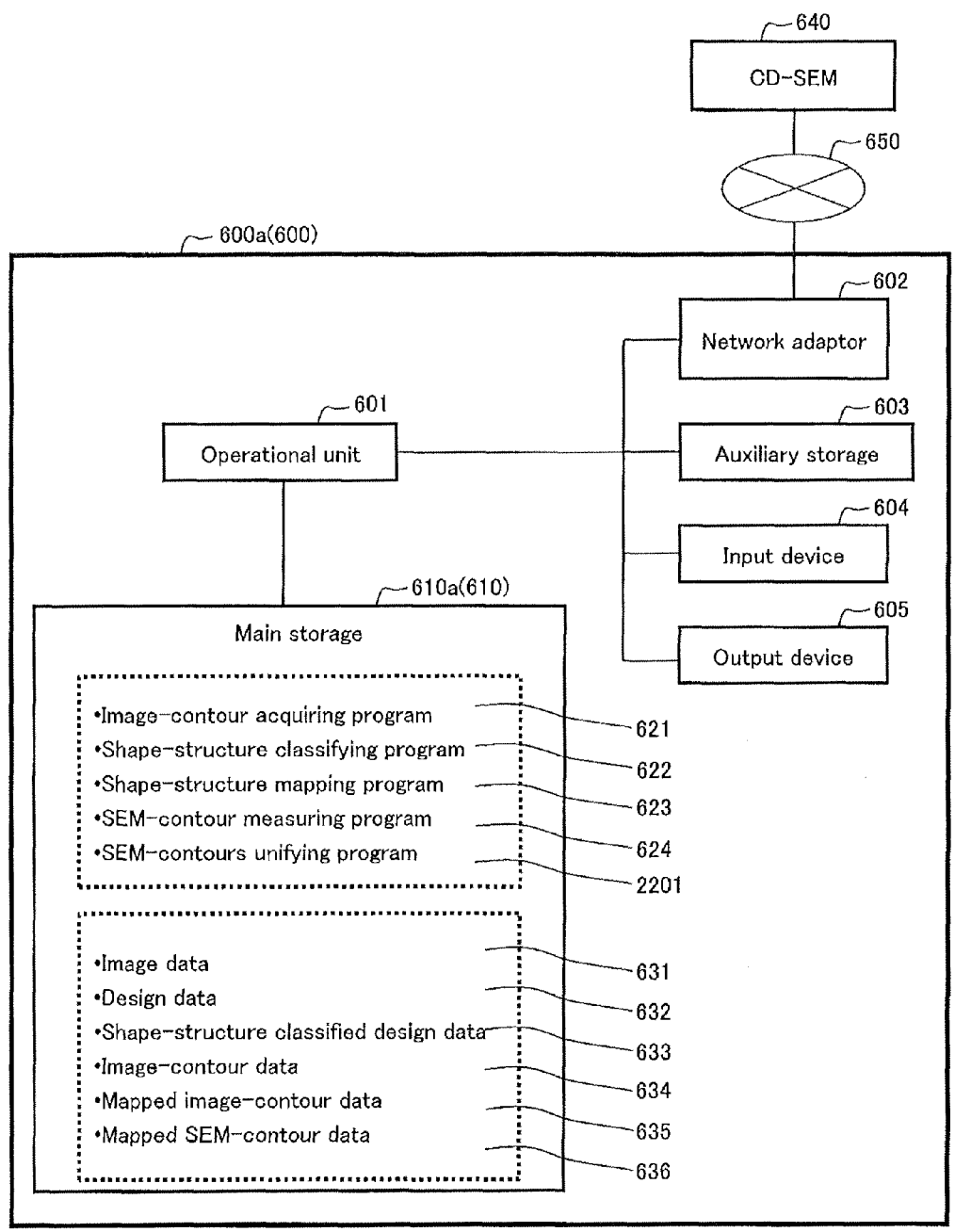
FIG. 22 shows an example of a configuration of a pattern measuring apparatus according to Modification 1.
Figure 23:
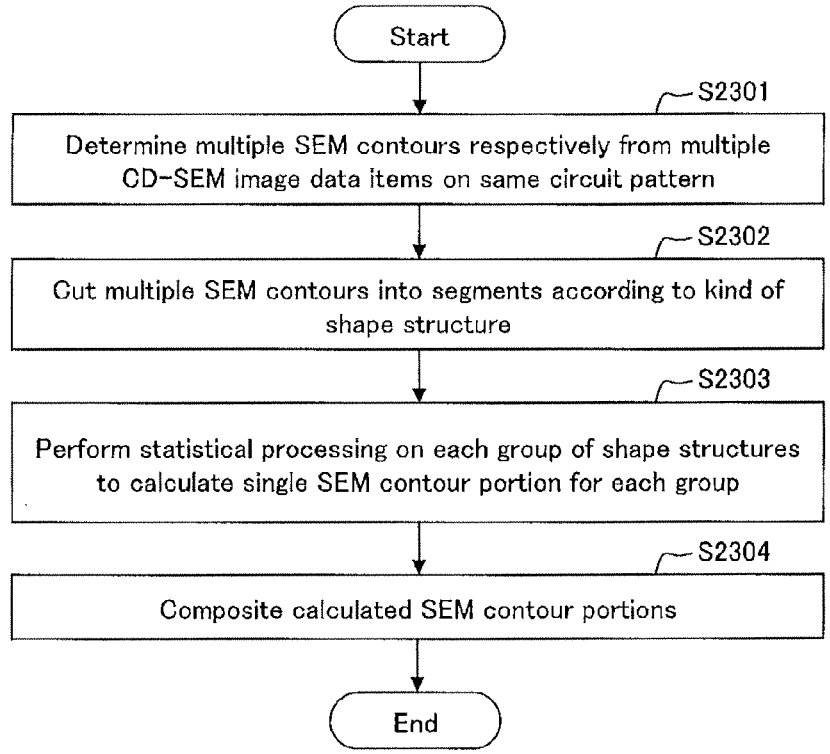
FIG. 23 shows an example of a flow of processing for measuring a circuit pattern according to Modification 1.
Figure 24:
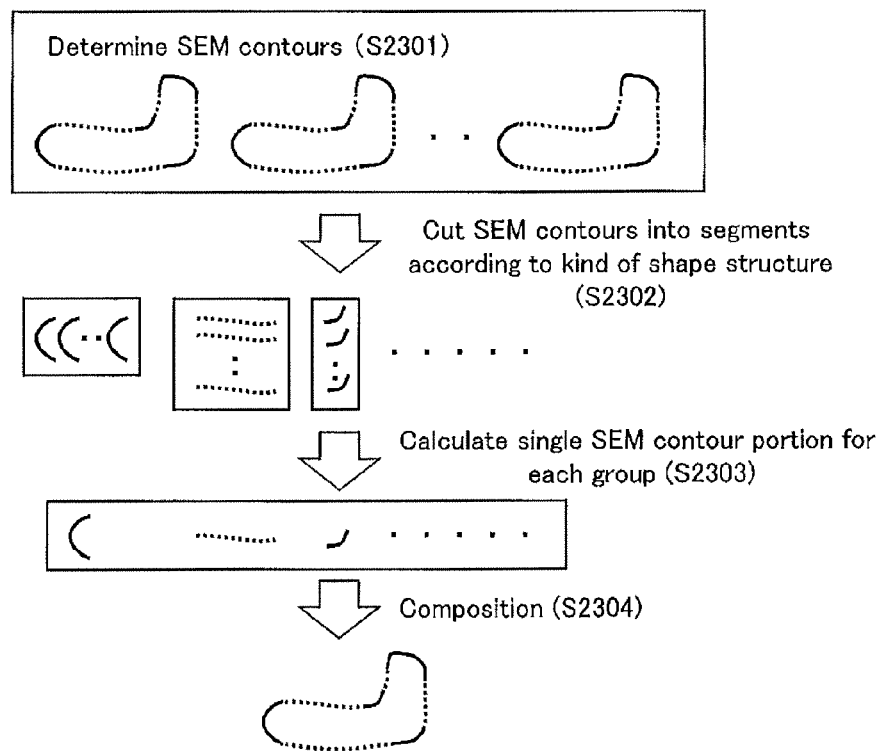
FIG. 24 is an explanatory view for the flow shown in FIG. 23.

FIG. 22 shows the configuration of a pattern measuring apparatus 600a (600) according to Modification 1. The pattern measuring apparatus 600a (600) shown in FIG. 22 is different from the pattern measuring apparatus 600 shown in FIG. 6 in that it further includes a SEM-contours unifying program 2201. In the following paragraphs, description will be made of a flow of processing executed by the SEM-contours unifying program 2201 with reference to FIG. 23 and FIG. 24.

In step S2301, two or more SEM contours are determined respectively from two or more CD-SEM image data items on the same circuit pattern. More specifically, two or more SEM contours are measured respectively from two or more CD-SEM image data items by following the flow of processing shown in FIG. 3. See S2301 in FIG. 24.

In step S2302, the two or more SEM contours calculated in step S2301 are cut into segments according to the kind of the shape structure. More specifically, the processing in step S304 in FIG. 3 is performed on the SEM contours determined in the step S2301 instead of the image contour to map the shape structures onto the SEM contours. Then, the SEM contours are cut into segments corresponding to the shape structures mapped thereon. See S2302 of FIG. 24.

In step S2303, statistical processing is performed on the positions of the segments of the SEM contours to calculate a single SEM contour portion for each kind of segments. More specifically, the two-dimensional coordinates of the segments of each kind are averaged to calculate the two-dimensional coordinates of a single SEM contour portion for each kind of segments. Alternatively, it is possible to calculate a polynomial curve that fits the two-dimensional coordinates of each kind of segments of the SEM contours to determine an approximation curve of the SEM contour. See S2302 of FIG. 24.

In step S2304, the sections calculated in step S2303 are connected to each other to composite the SEM contour. See S2304 of FIG. 24.

The above process makes it possible to determine the SEM contour more accurately than a process that uses a single CD-SEM image.

(Modification 2)

In general, images captured by electron microscopes such as the CD-SEM tend to have reduced image contrast depending on the direction of scan performed with the electron probe. For example, if the direction of scan performed with the electron probe is horizontal, horizontally extending white bands tend to be imaged unclearly. In other words, there is a risk that the SEM contour may be measured with low accuracy if the scan is performed in the same direction without considering the positions and shapes of the shape structures. To solve this problem, in step S305 of FIG. 3, the contrast is corrected according to the scan direction. By employing luminance characteristics after the contrast correction, it is possible determine the position of the SEM contour with high accuracy.

(Modification 3)

In Modification 3, exposure simulation is performed in consideration of optical proximity effects to calculate a contour to be used (see FIG. 3 as required).

First, in step S301 of FIG. 3, the image contour of a circuit pattern formed is acquired as in the first embodiment. Then, exposure simulation is performed to acquire a contour as a simulation image contour. A position at which this simulation image contour is to be placed is determined by the ICP method so that the positional difference between the simulation image contour and the image contour acquired in step S301 is minimized. The position of the simulation image contour is stored into the main storage 610 or the auxiliary storage 603 after the simulation image contour is overlaid onto the image contour.

In steps S302-S304, the processing employed in the first embodiment is performed by using the simulation image contour instead of the image contour acquired in step S301.

If the position of the SEM contour is determined in step S305, the image contour acquired in step S301 is used instead of the simulation image contour to perform the processing employed in the first embodiment.

In Modification 3, it is possible to reduce the effect of a roughened image contour.

EXPLANATIONS OF REFERENCE NUMERALS

401 design data
402 hole
406 EOL (End-of-Line)
407 LINE
408 CORNER
600, 600a pattern measuring apparatus
601 operational unit (operational unit)
603 auxiliary storage (storage)
610, 610a main storage (storage)
621 image-contour acquiring program
622 shape-structure classifying program
623 shape-structure mapping program
624 SEM-contour measuring program
640 CD-SEM
1501 normal vector
1521 measurement box
2201 SEM-contours unifying program

What is claimed is:

1. A pattern measuring apparatus for determining coordinates of a scanning electron microscope (SEM) contour of a circuit pattern formed by transferring design data via a photomask, comprising:
    a storage for storing data on coordinates and luminance values of pixels of an image of the circuit pattern;
    an image contour acquiring unit configured to acquire a position of an image contour of the circuit pattern by scanning across a boundary between a region without the circuit pattern and a region with the circuit pattern to obtain the luminance values of the pixels of the image and to determine a position of a pixel with a maximum luminance value as the position of the image contour;
    a shape structure classifying unit configured to classify a contour shape of the design data into one or more shape structures characterizing the contour shape of the design data;
    a normal direction calculating unit configured to calculate, for each shape structure, normal directions to an approximation line obtained by approximating the shape structure with a smooth line;
    an arranging unit configured to arrange sections on the image contour in such a positional relation with each other as to form a same shape as the contour shape of the design data so that a circumferential ratio of each of the sections to the image contour is equal to a circumferential ratio of a corresponding one of the shape structures to the design data; and
    a SEM-contour position acquiring unit configured to acquire the coordinates of the SEM contour by scanning across the image contour in the normal directions calculated for the shape structures corresponding to the sections arranged on the image contour to acquire luminance values of pixels in the normal directions, and to multiply maximum luminance values of the acquired luminance values by a given factor to determine coordinates of pixels with luminance values thus obtained as the coordinates of the SEM contour.

2. The pattern measuring apparatus of claim 1, wherein the one or more shape structures are each any one of a line segment, a CORNER and a LINE end, or a combination of two or more of these.

3. The pattern measuring apparatus of claim 1, wherein the SEM-contour position acquiring unit is configured to set a rectangular region for each normal direction in such a manner that the rectangular region extends to cross the image contour, the rectangular region having long sides extending in the direction of the normal direction and short sides crossing the long sides at a right angle and serving as a width of the rectangular region, wherein each rectangular region contains one or more scanlines in a number determined according the width of the rectangular region, and when one of the rectangular regions contains multiple scanlines, luminance values of pixels on the multiple scanlines in the rectangular region are averaged in the direction of the multiple normal vectors, then a maximum luminance value of the luminance values acquired by the averaging is multiplied by a given factor to determine coordinates of a pixel with a luminance value thus obtained as the coordinates of the SEM contour.

4. The pattern measuring apparatus of claim 3, wherein the longer a line segment crossing a rectangular region is, the wider the width of the rectangular region is.

5. The pattern measuring apparatus of claim 1, wherein the contour shape of the design data is a contour shape of design data with or without OPC (Optical Proximity Correction).

6. The pattern measuring apparatus of claim 1, wherein the arranging unit is configured to perform computation to reduce geometric differences between the respective shape structures and respective corresponding portions of the image contour for arranging the sections on the image contour with the circumferential ratio of each of the sections to the image contour being equal to the circumferential ratio of a corresponding one of the shape structures to the design data.

7. The pattern measuring apparatus of claim 1, wherein
the SEM-contour position acquiring unit is configured to acquire two or more positions of respective SEM contours respectively from two or more critical dimension scanning electron microscope (CD-SEM) image data items on the same circuit pattern, the arranging unit is configured to arrange sections on each of the acquired SEM contours, instead of the image contour, so that circumferential ratios of each of the sections to the respective SEM contours are equal to a circumferential ratio of a corresponding one of the shape structures to the design data, and the pattern measuring apparatus further comprises a unit configured to cut the SEM contours into segments corresponding to circumferences of the sections, to perform statistical processing on positions of sections of each of same kinds to calculate a single SEM contour portion for each kind of segments, and to connect the calculated SEM contour portions to composite a contour serving as the SEM contour.

8. A pattern measuring method applied to a pattern measuring apparatus for determining coordinates of a SEM contour of a circuit pattern formed by transferring design data via a photomask, the pattern measuring apparatus comprising a storage for storing data on coordinates and luminance values of pixels of an image of the circuit pattern, the pattern measuring method comprising:
an image contour acquiring step of acquiring a position of an image contour of the circuit pattern by scanning across a boundary between a region without the circuit pattern and a region with the circuit pattern to obtain the luminance values of the pixels of the image and determining a position of a pixel with a maximum luminance value as the position of the image contour;

a shape structure classifying step of classifying a contour shape of the design data into one or more shape structures characterizing the contour shape of the design data;

a normal direction calculating step of calculating, for each shape structure, normal directions to an approximation line obtained by approximating the shape structure with a smooth line;

an arranging step of arranging sections on the image contour in such a positional relation with each other as to form a same shape as the contour shape of the design data so that a circumferential ratio of each of the sections to the image contour is equal to a circumferential ratio of a corresponding one of the shape structures to the design data; and a SEM-contour position acquiring step of acquiring the coordinates of the SEM contour by scanning across the image contour in the normal directions calculated for the shape structures corresponding to the sections arranged on the image contour to acquire luminance values of pixels in the normal directions, and multiplying maximum luminance values of the acquired luminance values by a given factor to determine coordinates of pixels with luminance values thus obtained as the coordinates of the SEM contour.

9. A pattern measuring apparatus for determining coordinates of a SEM contour of a circuit pattern formed by transferring design data via a photomask, comprising:
a storage for storing data on coordinates and luminance values of pixels of an image of the circuit pattern;

an image contour acquiring unit configured to acquire a position of an image contour of the circuit pattern by scanning across a boundary between a region without the circuit pattern and a region with the circuit pattern to obtain the luminance values of the pixels of the image and to determine a position of a pixel with a maximum luminance value as the position of the image contour;

a simulation unit configured to perform exposure simulation to calculate a simulation image contour of the circuit pattern, overlay the simulation image contour onto the image contour, and to store into the storage a position of the simulation image contour overlaid on the image contour;

a shape structure classifying unit configured to classify a contour shape of the design data into one or more shape structures characterizing the contour of the design data;

a normal direction calculating unit configured to calculate, for each shape structure, normal directions to an approximation line obtained by approximating the shape structure with a smooth line;

an arranging unit configured to arrange sections on the simulation image contour in such a positional relation with each other as to form a same shape as the contour shape of the design data so that a circumferential ratio of each of the sections to the simulation image contour is equal to a circumferential ratio of a corresponding one of the shape structures to the design data; and a SEM-contour position acquiring unit configured to acquire the coordinates of the SEM contour by scanning across the image contour in the normal directions calculated for the shape structures corresponding to the sections arranged on the simulation image contour to acquire luminance values of pixels in the normal directions, and to multiply maximum luminance values of the acquired luminance values by a given factor to determine coordinates of pixels with luminance values thus obtained as the coordinates of the SEM contour.

* * * * *